(12) United States Patent
Petrick

(10) Patent No.: US 7,880,487 B2
(45) Date of Patent: Feb. 1, 2011

(54) TEST LEAD PROBE WITH RETRACTABLE INSULATIVE SLEEVE

(75) Inventor: Steven Charles Petrick, Snohomish, WA (US)

(73) Assignee: Fluke Corporation, Everett, WA (US)

( * ) Notice: Subject to any disclaimer, the term of this patent is extended or adjusted under 35 U.S.C. 154(b) by 79 days.

(21) Appl. No.: 12/358,144

(22) Filed: Jan. 22, 2009

(65) Prior Publication Data
US 2010/0182027 A1 Jul. 22, 2010

(51) Int. Cl.
*G01R 31/02* (2006.01)
(52) U.S. Cl. .................... 324/754; 324/761
(58) Field of Classification Search ......... 324/754–758, 324/761–765, 719, 662, 72.5, 690; 439/289, 439/498, 638, 141, 140
See application file for complete search history.

(56) References Cited

U.S. PATENT DOCUMENTS

| | | | |
|---|---|---|---|
| 2,857,572 A | 10/1958 | Belart | 324/149 |
| 2,957,156 A | 10/1960 | Gatto et al. | 439/166 |
| 3,363,221 A | 1/1968 | Stark | 439/585 |
| 3,893,027 A * | 7/1975 | Veenendaal | 324/72.5 |
| 5,395,264 A | 3/1995 | Keith | 439/502 |
| 5,691,635 A | 11/1997 | Pot et al. | 324/115 |
| 6,062,884 A | 5/2000 | Messimer et al. | 439/172 |
| 6,400,167 B1 | 6/2002 | Gessfore et al. | 324/754 |
| 7,009,377 B2 | 3/2006 | Campbell et al. | 324/72.5 |
| 7,015,709 B2 | 3/2006 | Capps et al. | 324/754 |
| 7,114,970 B2 | 10/2006 | Head | 439/191 |
| 7,221,179 B1 | 5/2007 | Campbell | 324/761 |

OTHER PUBLICATIONS

Fluke Test Tools Catalog; vol. One; 2007; pp. 1-72.

* cited by examiner

*Primary Examiner*—Minh N Tang
*Assistant Examiner*—Trung Q Nguyen
(74) *Attorney, Agent, or Firm*—Dorsey & Whitney LLP

(57) ABSTRACT

The present invention is directed to a test probe having an indexable probe tip. In one embodiment, an insulative sleeve extends from the test probe and surrounds a portion of the exposed probe tip. The insulative sleeve is moveable relative to the probe tip and may be indexable to at least two positions. For instance, the insulative sleeve locks into a first position to provide a first length of the probe tip exposed from the insulative sleeve, and the insulative sleeve locks into a second position to provide a second length of the probe tip exposed from the insulative sleeve.

18 Claims, 5 Drawing Sheets

US 7,880,487 B2

TEST LEAD PROBE WITH RETRACTABLE INSULATIVE SLEEVE

TECHNICAL FIELD

This invention relates generally to test instrument lead probes, and more specifically one or more embodiments relate to test probes having adjustable length probe tips.

BACKGROUND OF THE INVENTION

Test instruments, such as multimeters, voltage meters, oscilloscopes and the like, are used to measure electrical parameters in various electrical devices. FIG. 1 illustrates an exemplary test instrument 100. The test instrument 100 has a test probe 102 that is coupled to an input/output 104 of the test instrument 100. The test probe 102 has a test lead 106 having a first end 108 that is coupled to the input/output 104 of the test instrument 100 and a second end 110 that is coupled to a probe body 112. The probe body 112 includes a tip 114, which is coupled to a test point (not shown) of a device (not shown) to be measured or tested. As will be clear to a person having ordinary skill in the art, a second test probe (not shown), such as a ground connector, may be coupled to input/output 105.

In general, different length test probe tips are used in various test applications. In the past, to accommodate the need for different length probe tips, various test probe assemblies having different probe tip lengths were used with test instruments. For instance, a user may have two sets of test probes, one probe set with long length probe tips and another set with short probe tips. Another method for accommodating for the need of different length probes has been to use probe tips that are removable from the probe holder or body. Thus, rather than replacing the entire probe assembly, only the probe tip needs to be replaced. However, both of these solutions require a user to have to manage two sets of test probes, either the entire test probe assembly or test probe tips. Often test points are located in an obstructed location and having multiple test probes or probe tips can result in problems for the user when switching out the different probes. For instance, the user may have difficulty carrying the extra probes or the equipment may put the user in an awkward position so that it is a challenge to change out the probes. Additionally, by having separate test probes, the user may misplace, drop, or lose the probes so that the appropriate probe or probe tip is not available when needed.

More recently, however, test probes have been designed with probe tips that are slideable within the probe holder or body. Thus, rather than replacing the entire probe assembly when a different length probe tip is required, the probe tip slides in and out of the probe body and is locked into position at a desired length. For instance, when a longer probe tip is required, a locking mechanism that holds the probe tip within the probe body may be released so that the probe tip is free to move within the probe body. A user may then slide the probe tip so that a greater portion of the probe tip is exposed from the probe body and lock the probe tip into position. Therefore, rather than replacing the probe assembly or the probe tip, a single probe tip may act as a varying length probe tip. When a long probe length is needed, the probe tip slides out of the probe body so that more of the probe tip extends from the probe body. When a short probe length is needed, some of the exposed probe tip slides back into the probe body so that less of the probe tip extends from the probe body. Consequently, a single probe tip provides versatility and a user does not need to carry around probes having varying lengths.

Recently safety standards have been developed that limit the length of the exposed probe tip. In particular, the International Electrotechnical Commission (IEC), under the guidance of Technical Committee (TC66), generated a safety standard for Test and Measurement Equipment related to test probes referenced as IEC-61010-031. This standard specifies requirements for test probe tips for various test applications. For instance, the safety standard specifies the length of the exposed metal tip of the probe used in industrial applications, referred to as category III (CAT III) and category IV (CAT IV) installation, must be less than 4 mm in length. The probe tip for low energy applications, such as used in household applications or category II (CAT II) installations, must be less than 18 mm in length. Having a probe tip with exposed metal 18 mm in length is important because this allows users to easily insert the probe tip into a standard wall socket for quick and accurate measurement, which is not possible with a 4 mm probe tip. For industrial applications (CAT III and CAT IV) where high energy exists, a reduced probe tip of 4 mm is important to help reduce risk of arcs and arc flash hazards, which is not an issue in CAT II environments.

Therefore, when using a slideable probe tip described above, a user will not know whether the exposed length of the probe tip is within the specified length to meet the safety standard unless a measurement is made on the exposed length of the probe tip each time the probe tip length is adjusted. This requires a user to carry a measurement tool and results in a time consuming second step. Although a user may expose a portion of the probe tip that is significantly less than required by the safety standards discussed above and not have to make a measurement, most applications require the entire amount allowed under the safety standard. For instance, in household application, a user will need a probe tip to be very close to the 18 mm maximum length because it will allow the user to insert the probe tip into standard wall sockets.

There is, therefore, a need for a test probe having an adjustable length probe tip that indexes to predetermined lengths. Additionally, there is a need for an adjustable probe tip that communicates to a user the length of the exposed probe tip.

SUMMARY OF THE INVENTION

Embodiments of the present invention are directed toward test probes used with test and measurement equipment, and more particularly, one or more embodiments relate to test probes with probe tips having lengths that are indexable to at least two positions. In one aspect of the invention a test probe includes a conductive member having a main section and a first end, the first end being defined by an electrically conductive tip. The test probe further includes an insulative member surrounding a portion of the main section of the conductive member. The test probe further includes an insulative sleeve positioned between the insulative member and the conductive member. The insulative sleeve may be mechanically coupled to the insulative member to cause axial movement of the insulative sleeve relative to the conductive member.

In another aspect of the invention a test probe includes an insulative member having an opening at a first end. An inner surface of the insulative member includes at least one protrusion. The test probe further includes an insulative sleeve positioned within the opening of the insulative member. The insulative sleeve has at least one slot aligned with a respective one of the at least one protrusion. The test probe further includes a conductive member extending from a first end of the insulative sleeve. The conductive member has an electrically conductive tip defining a first end.

Another aspect of the invention includes a method for adjusting a length of a probe tip exposed from an insulative component. The method includes providing a first length of the insulative sleeve extending from the test probe, and altering the length of the insulative sleeve extending from the test probe from the first length to a second length by physical characteristics in the test probe. The second length being a specific distance from the first length.

DETAILED DESCRIPTION OF PREFERRED EMBODIMENTS

Embodiments of the present invention are directed toward test probes used with test and measurement equipment, and more particularly, one or more embodiments relate to test probes with probe tips having lengths that are indexable to at least two positions. In some embodiments, a test probe includes a retractable insulative sleeve that indexes to a plurality of positions. The insulative sleeve may be indexed using a mechanical system, an optical system, or any combination thereof. Certain details are set forth below to provide a sufficient understanding of the embodiments of the invention. However, it will be clear to one skilled in the art that various embodiments of the invention may be practiced without these particular details.

Figure 1:
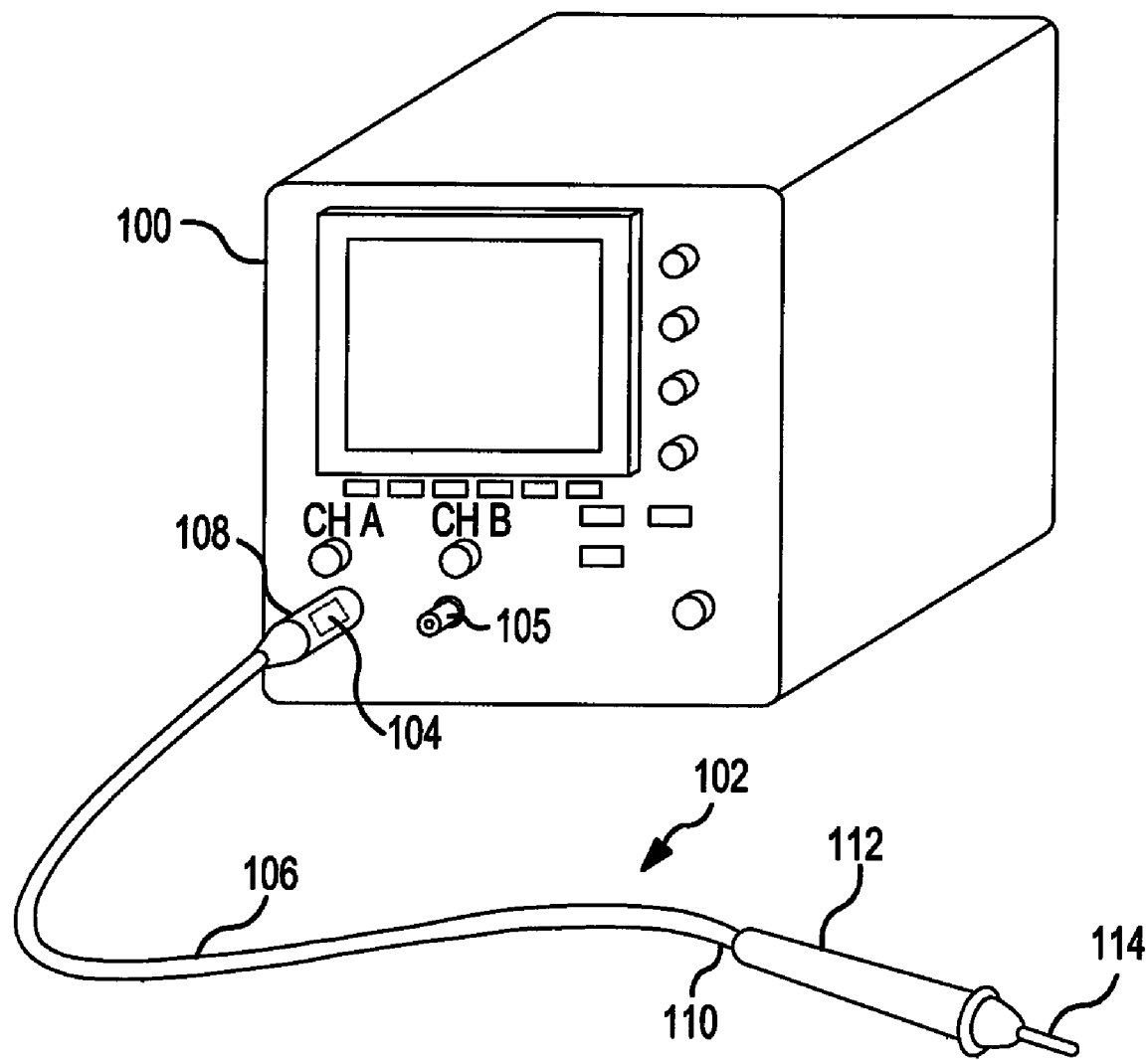
FIG. 1 is a schematic drawing of a test instrument in accordance with prior art.
Figure 2A:
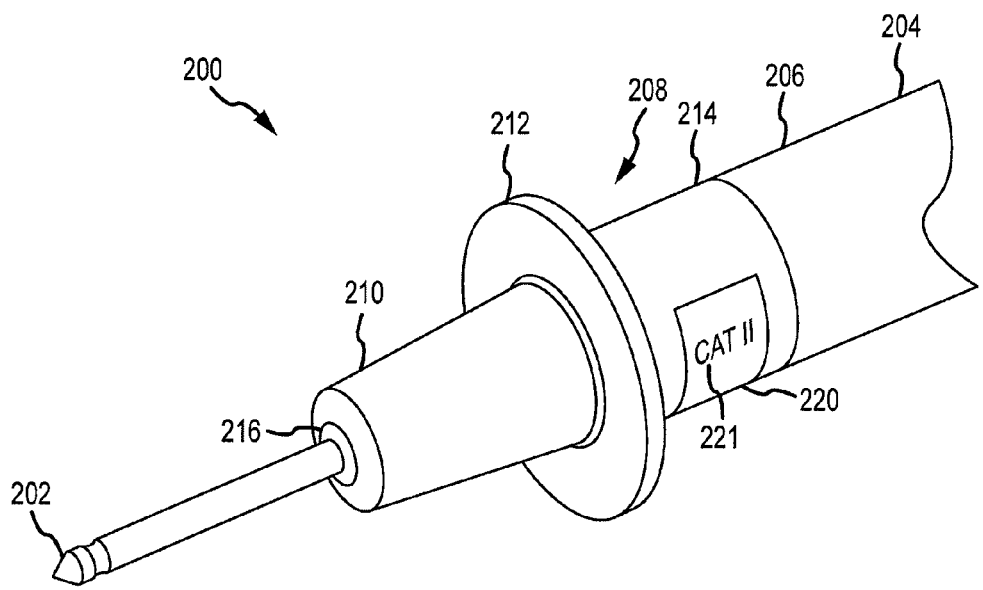
FIG. 2A is a schematic drawing of a test probe according to one embodiment of the invention.
Figure 2B:
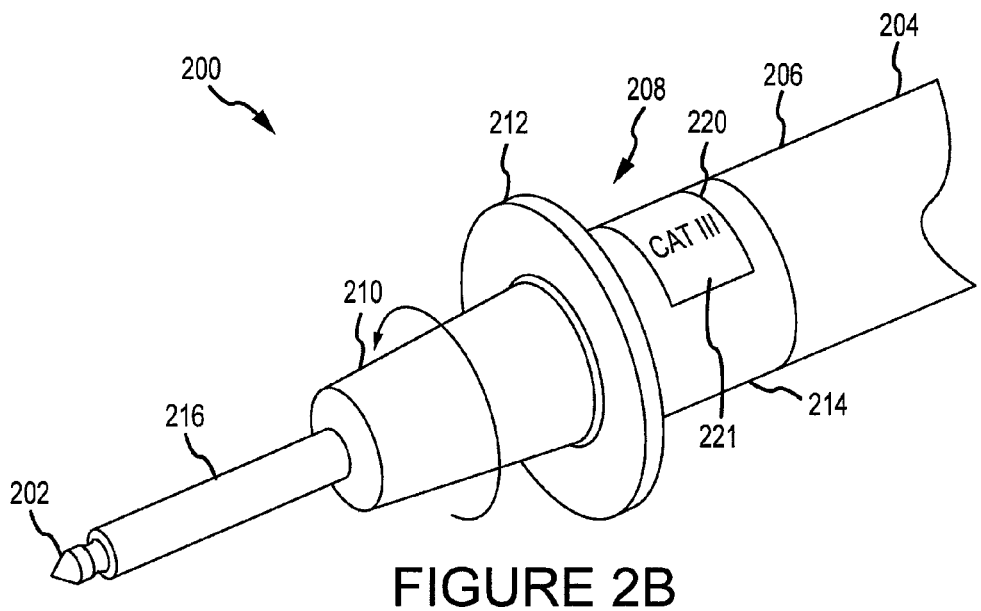
FIG. 2B is a schematic drawing of a test probe according to one embodiment of the invention.

FIGS. 2A and 2B are schematic drawings of a test probe 200 according to one embodiment of the invention. The test probe 200 in FIGS. 2A and 2B includes a probe tip 202 and a probe body 204. The probe tip 202 is made from an electrically conductive material, and is configured to be placed in electrical communication with a test point (not shown) of an electrical device (not shown). The probe body 204 is made from an insulative material. The probe body 204 and the probe tip 202 are configured to be coupled to a test lead (not shown). The test lead is configured to be coupled to an input/output of a test instrument (not shown).

The probe body 204 includes a handle portion 206 and a top portion 208. The handle portion 206 may be coupled to the test lead. The top portion 208 may include a nose 210, a finger guard 212, and a collar 214 or any combination thereof. The collar 214 of the top portion 208 is mechanically coupled to the handle portion 206 of the probe body 204. This coupling may be a press fit, snap fit, threaded coupling or any other mechanical coupling now known or later developed. An insulative sleeve 216 is positioned within the probe body 204 and extends from the nose 210 of the top portion 208. However, if the top portion 208 only includes a collar 214, the insulative sleeve would extend directly from the collar 214. The insulative sleeve 216 is made from an insulative material. The probe tip 202 extends from the insulative sleeve 216. In some embodiments, the probe tip 202 remains stationary within the probe body 204. However, the insulative sleeve 216 is extendable and retractable from the probe body 204.

In FIG. 2A the insulative sleeve 216 is retracted into the top portion 208 of the probe body 204. In FIG. 2B the insulative sleeve 216 extends from the top portion 208 of the probe body 204 so that the insulative sleeve 216 surrounds a portion of the probe tip 202. As can be seen from FIGS. 2A and 2B, when the insulative sleeve 216 is retracted into the top portion 208 of the probe body 204, more of the probe tip 202 is exposed then when the insulative sleeve 216 is extending from the top portion 208 of the probe body 204.

The insulative sleeve 216 extends and retracts from the nose 210 of the top portion 208 when the top portion 208 of the probe body 204 is rotated relative to the handle portion 206. By rotating the top portion 208 in a first direction the insulative sleeve 216 extends from the top portion 208. Conversely, by rotating the top portion 208 in a second direction, such as a direction opposite the first direction, the insulative sleeve 216 retracts into the probe body 204. Additionally, and in the embodiment shown in FIGS. 2A and 2B, the collar 214 of the top portion 208 of the probe body 204 may include an opening 220. The opening 220 may be aligned with a label 221 to communicate the length of the exposed probe tip 202 or the category rating that the length of the probe tip 202 is qualified for under the safety standards discussed above. For instance, the label 221 may be aligned with a first label when the insulative sleeve 216 is fully retracted into the probe body 204 as is shown in FIG. 2A and aligned with a second label when the insulative sleeve 216 is fully extended from the probe body 204 as is shown in FIG. 2B. Thus the label 221 communicates to a user the length of the probe tip 202 exposed from the insulative sleeve 216. This label 221 may be a visual element or a physical element. The label 221 may indicate the category rating the length is rated for or the actual length of the exposed probe tip 202.

Figure 3A:
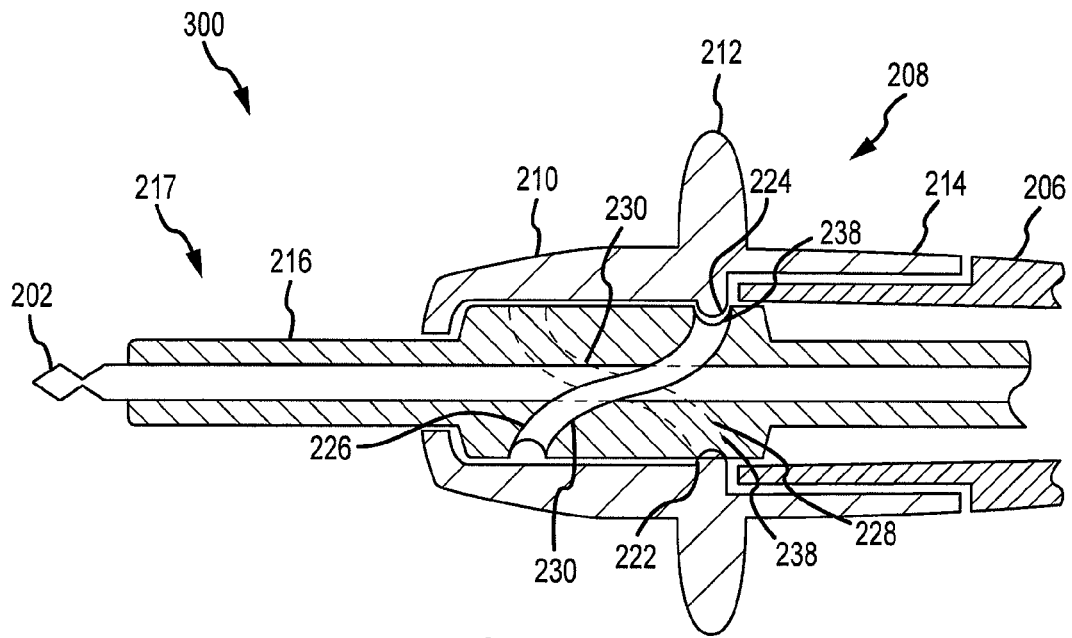
FIG. 3A is a cross sectional schematic drawing of a test probe according to one embodiment of the invention.
Figure 3B:
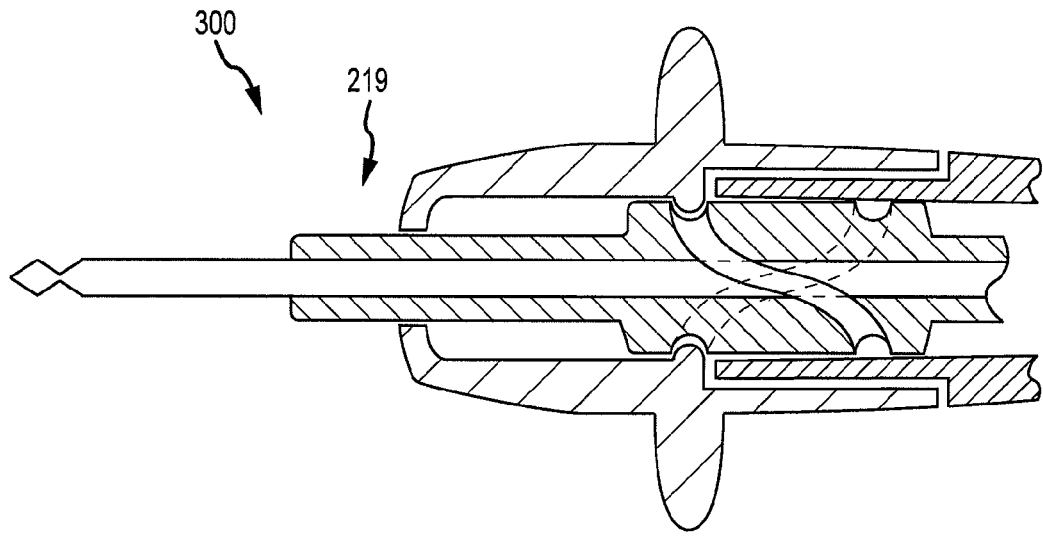
FIG. 3B is a cross sectional schematic drawing of a test probe according to one embodiment of the invention.

FIGS. 3A and 3B are cross sectional schematic drawings of a test probe 300 comprising a test probe tip 202, an insulative sleeve 216, a top portion 208, and a handle portion 206 of a probe body according to one embodiment of the invention. The top portion 208 of the probe body includes a nose 210, a finger guard 212, and a collar 214 as described in reference to FIGS. 2A and 2B. In this embodiment, an inner surface of the top portion 208 includes two protrusions or pins 222 and 224. The insulative sleeve includes two helices 226 and 228, which in the embodiment shown are cut outs along the surface of the insulative sleeve 216. The protrusions 222 and 224 on the inner surface of the top portion 208 are positioned so that as the top portion 208 is rotated in a first direction, the protrusions 222 and 224 guide the movement of the insulative sleeve 216 by moving along the respective helices 226 and 228, thus, causing the insulative sleeve 216 to extend from the top portion 208 of the probe as is shown in the test probe 300 in FIG. 3A. As the top portion 208 of the probe is rotated again, the pins 222 and 224 guide the movement of the insulative sleeve 216 causing the insulative sleeve 216 to retract into the top portion 208 of the probe as is shown in FIG. 3B. The embodiment in FIGS. 3A and 3B show the top portion having two pins. However, as will be clear to a person of ordinary skill in the art the top portion may have only one pin or more than two pins to guide the movement of the insulative sleeve. In one embodiment, if the top portion has one pin, then the insulative sleeve may have one helix. In one embodiment, the top portion 208 may be rotated in the same direction to extend and retract the probe tip 202. In another embodiment, the top portion 208 may be rotated in a first direction to extend the probe tip 202 and rotated in the opposite direction to retract the probe tip 202.

Figure 4A:
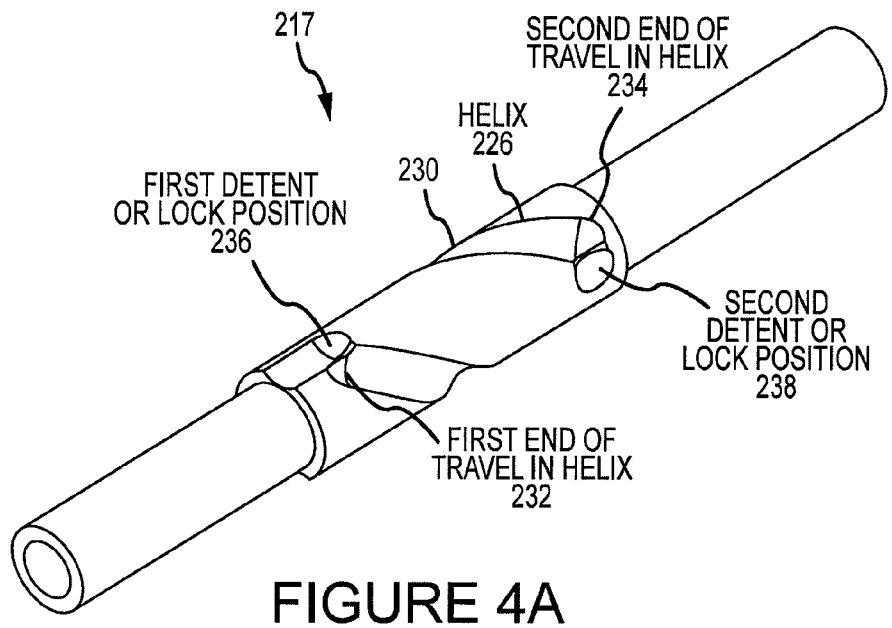
FIG. 4A is an isometric schematic drawing of an insulative sleeve according to one embodiment of the invention.
Figure 4B:
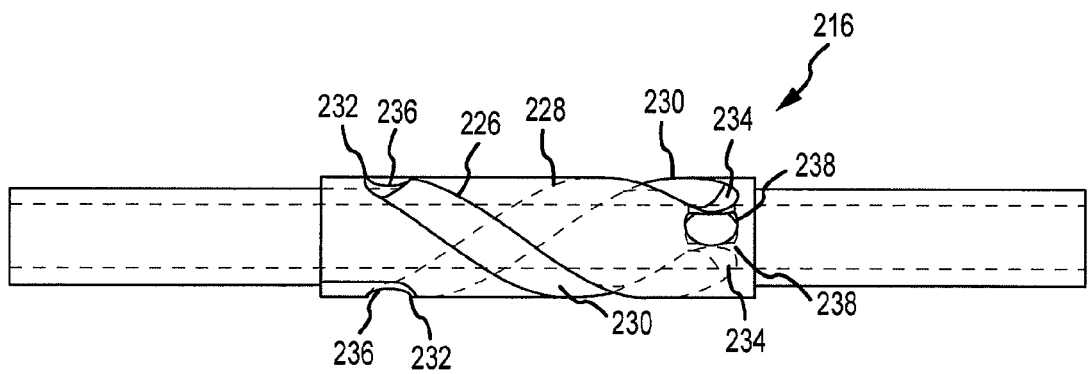
FIG. 4B is an isometric schematic drawing of an insulative sleeve according to one embodiment of the invention.

FIG. 4A is an isometric schematic drawing of an insulative sleeve 217 according to one embodiment of the invention. The insulative sleeve 217 is designed to be used with a single pin. The insulative sleeve 217 includes a helix 226 having a main section 230, a first end 232, and a second end 234. The first end 232 of the helix 226 has a first detent or first lock position 236 and the second end 234 of the helix 226 has a second detent or second lock position 238. When a pin is positioned in either the first or second detent 236 and 238, the pin is moved out of the main section 230 of the helix 226. More particularly, when the pin is positioned in either the first or second detent 236 and 238, the insulative sleeve 217 is latched into position relative to the probe. FIG. 4B is an isometric schematic drawing of an insulative sleeve 216 according to another embodiment of the invention. The insulative sleeve 216 includes two helices 226 and 228. Each helix 226 and 228 has a main section 230, a first end 232 of the helix, a second end 234 of the helix, a first detent 236 and a second detent 238.

Moving the insulative sleeve 216 from a first position 217 to a second position 219 will now be explained in reference to FIGS. 3A, 3B, and 4B. In FIG. 3A, the pins 222 and 224 are latched in a respective second detent 238. When the pins 222 and 224 are latched in the second detent 238, the insulative sleeve 216 is fully extended and insulates a portion of the probe tip 202 that extends from the top portion 208 of the probe body. Thus, the exposed length of the probe tip 202 is the length that extends from the insulative sleeve 216. To cause the insulative sleeve 216 to retract into the top portion 208 of the probe body, a rotational force may be applied to the top portion 208 to cause the pins 222 and 224 to enter a respective second end 234 of the helices 226 and 228. Once the pins 222 and 224 are positioned within the second end 234 of the helices 226 and 228, the top portion 208 of the probe body may be further rotated to cause the pins 222 and 224 to guide the insulative sleeve 216 to move along the main section 230 of the helices 226 and 228. As the pins 222 and 224 move along the main section 230 of the respective helices 226 and 228 from the second end 238 to the first end 232, the insulative sleeve 216 retracts into the top portion 208 of the probe body. The pins 222 and 224 move along the respective main section 230 of the helices 226 and 228 until the pins 222 and 224 reach the first end 232 of the helices 226 and 228. At the first end 232 of the helices 226 and 228, as the top portion 208 is further rotated, the pins 222 and 224 are positioned in the first detent 236. When the pins are positioned in the first detent, the insulative sleeve is fully retracted into the probe.

The rotation force required to move the pins 222 and 224 from the first detent to the first end of the helix is generally greater than the rotation force required to move the pin along the main section of the helix. Similarly, the rotational force required to move the pin from the second detent to the second end of the helix is generally greater than the rotation force required to move the pin along the main section of the helix. Therefore, when the pin is positioned in either the first detent or the second detent, the insulative sleeve is latched into a respective position.

Figure 5A:
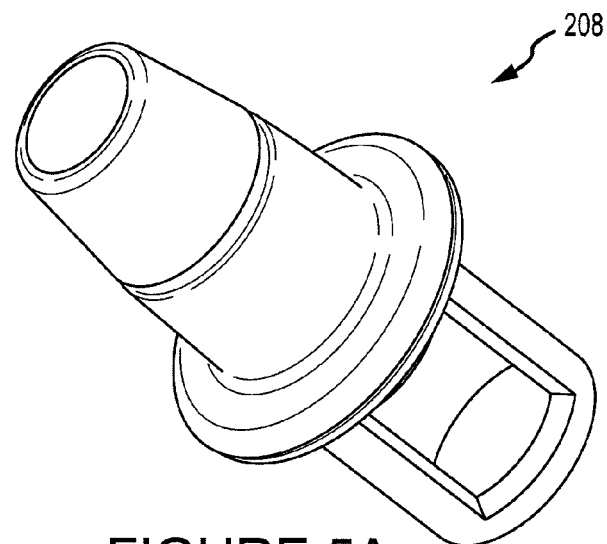
FIG. 5A is an isometric schematic drawing of the top portion of the probe body according to one embodiment of the invention.
Figures 5B, 5C:
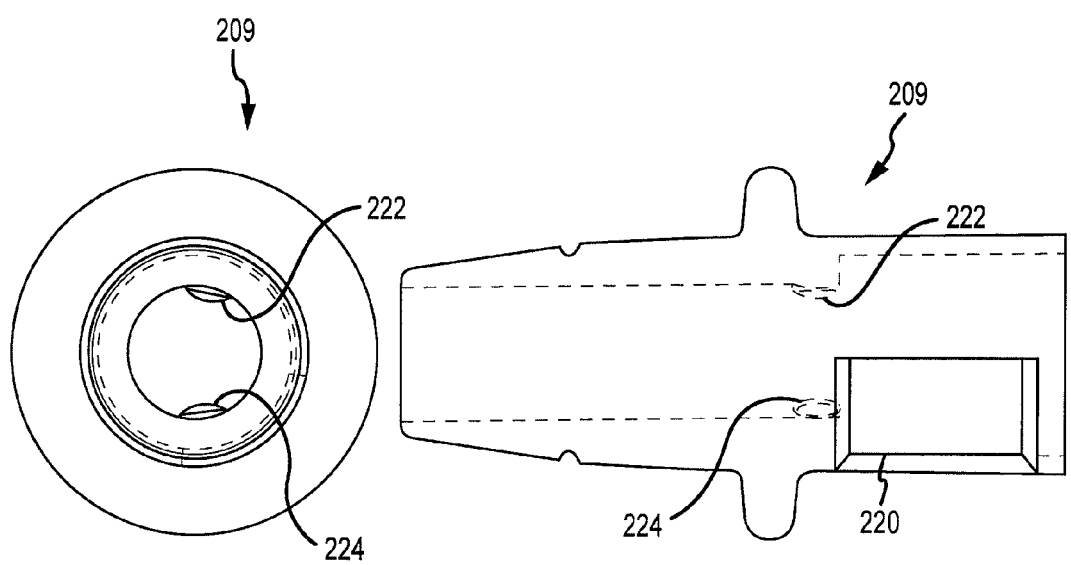
FIG. 5B is a cross sectional schematic drawing of the top portion of the probe body according to one embodiment of the invention.
FIG. 5C is an schematic drawing of the top portion of the probe body according to one embodiment of the invention.

FIG. 5A is an isometric schematic drawing of the top portion 208 shown in FIGS. 3A and 3B. FIG. 5B is cross sectional schematic drawing of the top portion in FIG. 5A. FIG. 5C is an schematic drawing of the top portion in FIG. 5A. In this embodiment and as is most clearly shown in FIGS. 5B and 5C, the top portion 208 includes two pins 222 and 224. As discussed above, the two pins 222 and 224 are configured to be positioned so that they are aligned with the helices 226 and 228 on the insulative sleeve 216. Additionally, the top portion 208 further includes an opening 220 to be aligned with a label. The label communicates the length of the exposed probe tip 202 or the category rating that the length of the probe tip 202 is qualified for under the safety standards discussed above. For instance, in one embodiment when the insulative sleeve 216 is fully extending from the nose 210 so that the pins 222 and 224 are positioned in the first detents 236, a first label may be aligned with the opening 220. Conversely, when the insulative sleeve 216 is retracted into the nose 210 so that the pins 222 and 224 are positioned in the second detents 238, a second label may be aligned with the opening 220. The first and second labels may be positioned on any appropriate device that is operable to be aligned with the opening 220. In one embodiment, the labels are positioned on a portion of the probe body 204. In another embodiment, the labels are positioned on a portion of the insulative sleeve 216. As stated above, each label indicates to a user which category rating the length of the exposed part of the probe tip is rated for.

Although the present invention has been described with reference to the disclosed embodiments, persons skilled in the art will recognize that changes may be made in form and detail without departing from the spirit and scope of the invention. For instance, the insulative sleeve may be indexable to a plurality of positions. The insulative sleeve may have a first and second detent coupled together by a first main helix as described above, but also a third detent coupled to the second detent by a second main helix. Therefore, the insulative sleeve would be able to latch into a third position, when the pin is positioned in the third detent. This third position would result in a third length of the probe tip extending from the top portion of the probe body. Additionally, the insulative sleeve may extend to a third position in which the insulative sleeve completely covers the probe tip. Furthermore, any means of communication may be used to communicate to a user that the probe tip or the insulative sleeve has been indexed, such as a visual element, an audio element, or a raised surface on the label portion that a user can feel to determine the length of the exposed probe tip or the category rating. Any method of latching the insulative sleeve into a particular position may be used. Such modifications are well within the skill of those ordinarily skilled in the art. Accordingly, the invention is not limited except as by the appended claims.

What is claimed is:

1. A test probe, comprising:
   a conductive member having a main section and a first end, the first end being defined by an electrically conductive tip;
   an insulative member surrounding a portion of the main section of the conductive member; and
   an insulative sleeve positioned between the insulative member and the conductive member, the insulative sleeve mechanically coupled to the insulative member to cause axial movement of the insulative sleeve relative to the conductive member and insulative member responsive to rotating the insulative member relative to the insulative sleeve.

2. The test probe of claim 1 wherein the mechanical coupling includes a protrusion on an inner surface of the insulative member aligned with a slot on the insulative sleeve.

3. The test probe of claim 2 wherein rotating the insulative member causes the protrusion to move the insulative sleeve from a first position to a second position.

4. The test probe of claim 2 wherein the slot has a first recess at a first end and a second recess at a second end.

5. The test probe of claim 4 wherein when the protrusion is positioned in the first recess or the second recess, a greater force is required to rotate the insulative member relative to the insulative sleeve than when the protrusion is positioned in the slot.

6. The test probe of claim 1 wherein the insulative member has an opening aligned with a label portion on a second insulative member, the label portion describing the length of the conductive member that is exposed from an end of the insulative sleeve or the category safety rating for the length of the conductive member that is exposed from the end of the insulative sleeve.

7. A test probe, comprising:
an insulative member having an opening at a first end, an inner surface of the insulative member including at least one protrusion;
an insulative sleeve positioned within the opening of the insulative member, the insulative sleeve having at least one slot aligned with a respective one of the at least one protrusions;
a conductive member extending from a first end of the insulative sleeve, the conductive member having an electrically conductive tip defining a first end, the insulative member and insulative sleeve configured to cause the insulative sleeve to slide relative to the conductive member responsive to rotating the insulative member relative to the insulative sleeve.

8. The test probe of claim 7 wherein the at least one slot is a helix.

9. The test probe of claim 8 wherein the helix includes a first recess at a first end and a second recess at a second end.

10. The test probe of claim 9 wherein the insulative sleeve locks relative to the conductive member when the at least one protrusion is positioned within the respective first or second recess.

11. The test probe of claim 10 wherein a first length of the conductive member extends from the insulative sleeve when the at least one protrusion is positioned in the first recess and a second length of the conductive member is exposed from the insulative sleeve when the at least one protrusion is positioned in the second recess, the first length being a specific distance from the second length.

12. The test probe of claim 7 wherein the insulative member includes a label portion describing an characteristic of the conductive member extending from the insulative sleeve when the protrusion is positioned in the first detent.

13. The test probe of claim 7 wherein the insulative member includes a label portion describing a category rating for the length of the conductive member exposed from the insulative sleeve when the protrusion is positioned in the first detent.

14. A method for adjusting a length of a probe tip exposed from an insulative sleeve in a test probe, comprising:
providing a first length of the insulative sleeve extending from the test probe; and
altering the length of the insulative sleeve extending from the test probe from the first length to a second length by altering the length of the probe tip exposed from the insulative sleeve, the first and second lengths being determined by physical characteristics in the test probe.

15. The method of claim 14 further comprising indicating that the length of the probe tip exposed from the insulative sleeve is less than a particular length.

16. The method of claim 14 further comprising indicating that the length of the probe tip exposed from the insulative material meets a requirement for a particular application.

17. The method of claim 14 wherein the act of altering the length of the insulative sleeve extending from the test probe comprises rotating a first insulative material relative to a second insulative material to cause the insulative sleeve to move axially relative to the probe tip.

18. The method of claim 17 wherein the physical characteristics in the test probe that alter the length of the insulative sleeve extending from the test probe includes a protrusion on an inner surface of the first insulative material that travels along a helix on an outer surface of the second insulative material.

* * * * *